(12) United States Patent
Kawakami et al.

(10) Patent No.: US 7,460,427 B2
(45) Date of Patent: Dec. 2, 2008

(54) SEMICONDUCTOR INTEGRATED CIRCUIT DEVICE

(75) Inventors: Koichi Kawakami, Yokohama (JP); Hiroshi Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 562 days.

(21) Appl. No.: 11/209,730

(22) Filed: Aug. 24, 2005

(65) Prior Publication Data

US 2006/0044917 A1    Mar. 2, 2006

(30) Foreign Application Priority Data

Aug. 31, 2004    (JP)    ............... 2004-252673

(51) Int. Cl.
    G11C 7/00    (2006.01)
(52) U.S. Cl. .............. 365/225; 365/189.09; 365/185.11
(58) Field of Classification Search ................. 365/225, 365/200, 185.11, 189.09, 191, 189.11, 241
    See application file for complete search history.

(56) References Cited

U.S. PATENT DOCUMENTS

| 5,889,721 A | 3/1999 | Gannage |
| 6,870,786 B2 | 3/2005 | Kanda et al. |
| 2002/0114184 A1* | 8/2002 | Gongwer et al. ........ 365/185.11 |
| 2003/0035328 A1* | 2/2003 | Hamamatsu et al. ........ 365/200 |

FOREIGN PATENT DOCUMENTS

JP    11-39866    2/1999

* cited by examiner

*Primary Examiner*—Dang T Nguyen
(74) *Attorney, Agent, or Firm*—Oblon, Spivak, McClelland, Maier & Neustadt, P.C.

(57) ABSTRACT

A semiconductor memory device includes: an ID code memory circuit configured to store ID code data bits in a non-volatile manner; an ID code generating circuit configured to generate an ID code based on the data bits stored in the ID code memory circuit and output it to an external terminal; a power supply voltage detecting circuit configured to detect a power supply voltage supplied from the external and supply a select signal to at least one of the ID code memory circuit and ID code generating circuit for selectively generating one of ID codes, data bits of which are different from each other at least in part in correspondence with power supply voltage levels.

24 Claims, 15 Drawing Sheets

FIG. 9

| | | Block Size | Vcc | I/O | I/O7 | I/O6 | I/O5 | ... | I/O0 |
|---|---|---|---|---|---|---|---|---|---|
| Code0 | 1Gbit | 2LC | 16KB | 3V/1.8V | ×16/×8 | 0 | 1 | 1 | | 1 |
| Code1 | 1Gbit | 2LC | 16KB | 3V | ×8 | 0 | 1 | 1 | | 1 |
| Code2 | 1Gbit | 2LC | 16KB | 1.8V | ×8 | 0 | 1 | 1 | | 0 |
| Code3 | 1Gbit | 2LC | 16KB | 3V | ×16 | 0 | 1 | 1 | | 0 |

Device Code

SEMICONDUCTOR INTEGRATED CIRCUIT DEVICE

CROSS-REFERENCE TO RELATED APPLICATION

This application is based on and claims the benefit of priority from the prior Japanese Patent Application No. 2004-252673, filed on Aug. 31, 2004, the entire contents of which are incorporated herein by reference.

BACKGROUND OF THE INVENTION

1. Field of the Invention

This invention relates to a semiconductor integrated circuit device, which is able to output an ID code serving as device identifying information.

2. Description of Related Art

In conventional semiconductor integrated circuit devices, various identifying data (i.e. ID code data), such as a maker code, a device code and the like, are stored. These ID codes are basically used in need of device checking for the device maker. Recently, it is often dealt with that these ID codes are free from the maker to users to be referable.

ID codes are stored in, for example, a fuse circuit like as a redundancy-use defective address storage circuit. There has already been provided a semiconductor memory device, in which ID codes are stored in a fuse circuit to be able to output to an external terminal in response to a command input (refer to, for example, Japanese Patent Application Publication No. 2003-187593).

In a semiconductor memory such as a flash memory, with relation to the external system equipped with it, it is often determined to have different device specifications for indicating whether the memory device is adaptable to 3V power supply voltage or 1.8V power supply voltage to the external system. If the memory chip is adaptable to both 3V and 1.8V power supply voltages under the above-described device specifications, it has need to output different device codes to external systems with 3V and 1.8V power supply voltages, respectively. Further, if these device codes are prepared independently of each other in the memory chip, not only it is required of the memory chip to have a large area of the ID code memory circuit, but also it takes a lot of time to program it.

SUMMARY OF THE INVENTION

According to an aspect of the present invention, there is provided a semiconductor integrated circuit device including:

an ID code memory circuit configured to store ID code data bits in a non-volatile manner;

an ID code generating circuit configured to generate an ID code based on the data bits stored in the ID code memory circuit and output it to an external terminal;

a power supply voltage detecting circuit configured to detect a power supply voltage supplied from the external and supply a select signal to at least one of the ID code memory circuit and ID code generating circuit for selectively generating one of ID codes, data bits of which are different from each other at least in part in correspondence with power supply voltage levels.

According to another aspect of the invention, there is provided a semiconductor integrated circuit device comprising:

a memory cell array, in which electrically rewritable and non-volatile memory cells are arranged;

a read/write circuit configured to read data of and write data in the memory cell array;

an ID code memory circuit configured to store ID code data bits in a non-volatile manner;

an ID code generating circuit configured to generate an ID code based on the data bits stored in the ID code memory circuit and output it to an external terminal;

a power supply voltage detecting circuit configured to detect a power supply voltage supplied from the external and supply a select signal to at least one of the ID code memory circuit and ID code generating circuit for selectively generating one of ID codes, data bits of which are different from each other at least in part in correspondence with power supply voltage levels.

BRIEF DESCRIPTION OF THE DRAWINGS

FIG. 9 shows a part of the device code specification of the flash memory.

DETAILED DESCRIPTION OF THE EMBODIMENTS

Illustrative embodiments of this invention will be explained with reference to the accompanying drawings below.

Figure 1:
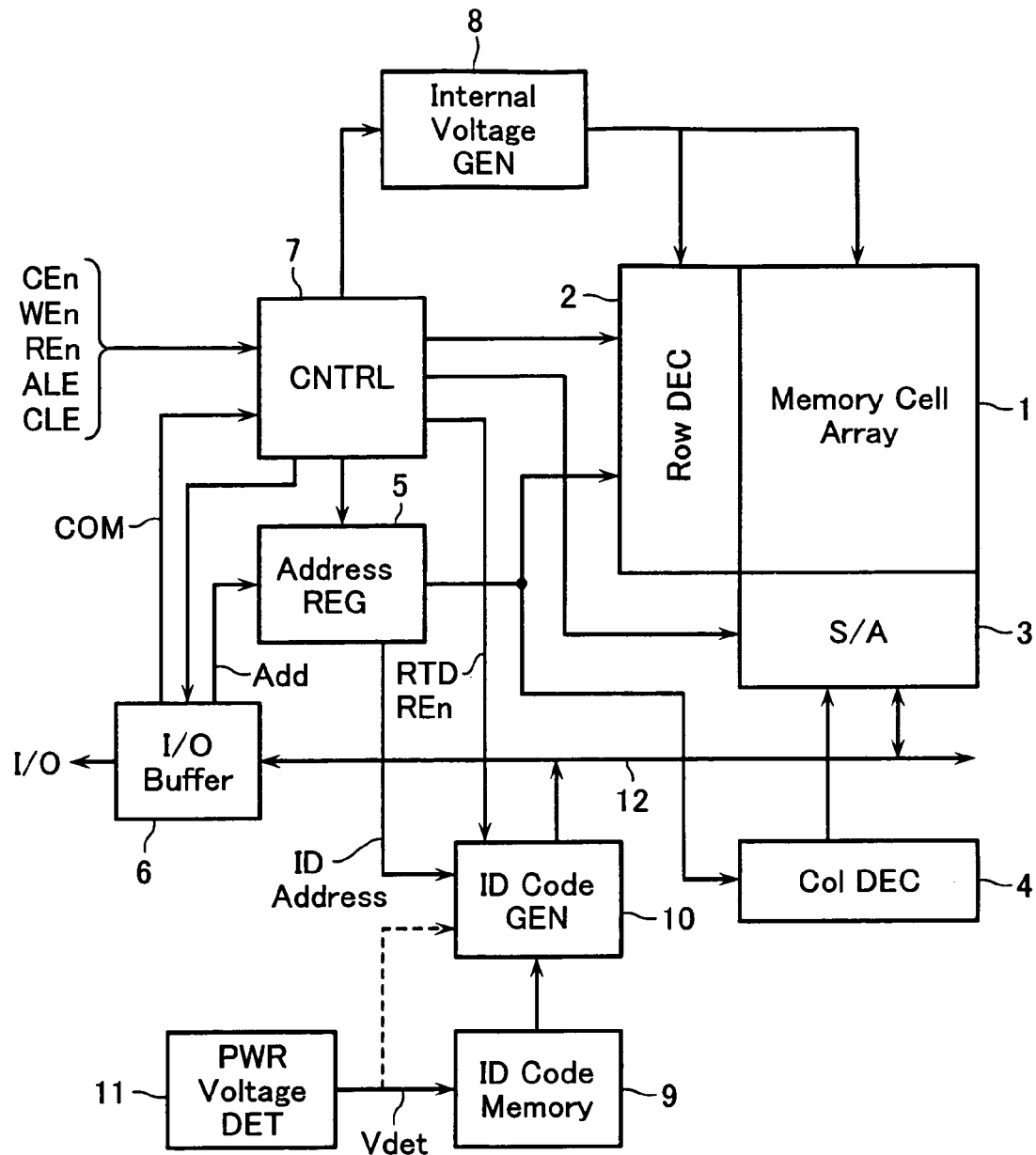
FIG. 1 shows a functional block configuration of a NAND-type flash memory in accordance with an embodiment of the present invention.

FIG. 1 shows a functional block of a flash memory in accordance with an embodiment. A memory core circuit includes a memory cell array 1, a row decoder (including word line drivers) 2 for selecting word lines of the memory cell array 1 and a sense amplifier circuit (serving as a data latch circuit) 3 which is connected to bit lines of the memory cell array to serve for performing data read and write. The sense amplifier circuit 3 includes column select gates, which are driven by a column decoder 4.

Row decoder 2, column decoder 4 and sense amplifier circuit 3 constitute a read/write circuit for reading data of and writing data in the memory cell array 1.

Data transfer between the sense amplifier circuit 3 and external input/output terminals I/O is performed via data line 12 and I/O buffer 6. An address "Add" supplied from the external terminals I/O is supplied to the row decoder 2 and column decoder 4 via an address register 5. A command "COM" supplied from the external terminals I/O is decoded in the controller 7.

The controller 7 controls transferring of the address "Add" and command "COM", a write sequence, an erase sequence and a read operation based on the command "COM" and various external control signals (chip enable signal CEn, write enable signal WEn, read enable signal REn, address latch enable signal ALE, command latch enable signal CLE and the like).

An internal voltage generating circuit 8 is prepared to generate various high voltages necessary for operation modes under the control of the controller 7.

Figure 2:
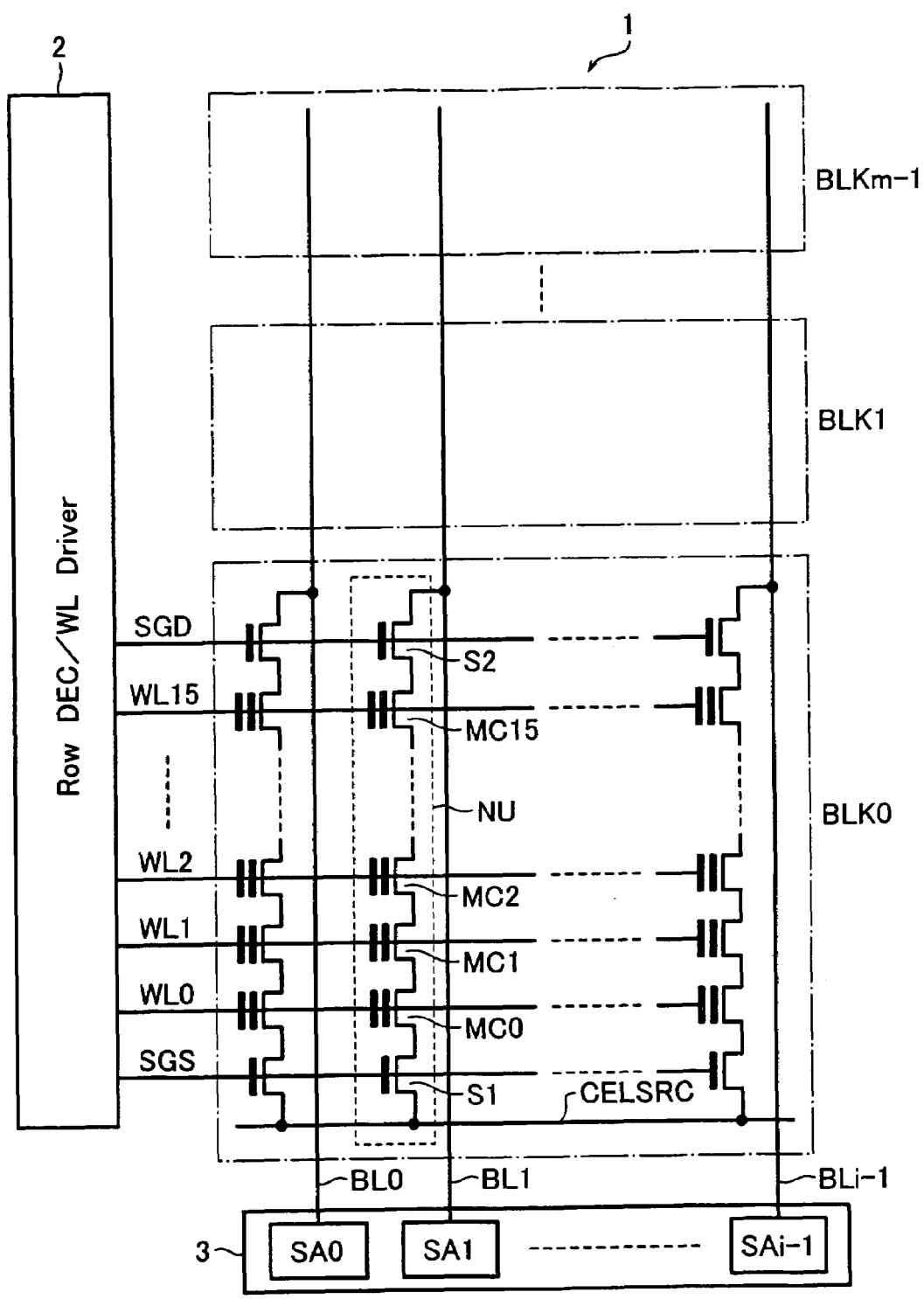
FIG. 2 shows the arrangement of the memory cell array in the flash memory.

The memory cell array 1 is, for example as shown in FIG. 2, is formed of plural NAND cell units NU arranged therein. Each NAND cell unit NU has a plurality of (sixteen in this case) electrically rewritable and non-volatile memory cells MC0-MC15 connected in series. One end of the memory cell string is coupled to a bit line BL via select gate transistor SG2; and the other end thereof to a common source line CELSRC via select gate transistor SG1. Control gates of these memory cells MC0-MC15 are coupled to word lines WL0-WL15, respectively.

A set of NAND cell units sharing the word lines WL0-WL15 is defined as a block, which usually serves as a unit for data erase. As shown in FIG. 2, plural blocks are arranged in the direction of the bit line BL. A set of memory cells sharing a word line constitutes a page (or two pages), which serves as a unit for data read and write. In the periphery of the chip, an ID code memory circuit 9 is disposed to store device identifying data (maker ID code, device ID code and the like) in a non-volatile manner. To output a required ID code outside of the chip based on the data stored in the ID code memory circuit 9, there is prepared an ID code generating circuit 10.

Further in this embodiment, to detect the voltage range of the external power supply voltage, a power supply voltage detecting circuit 11 is prepared, and detected output Vdet thereof is supplied to the ID code memory circuit 9 or ID code generating circuit as an ID code selecting signal, which is defined in accordance with the external power supply voltage.

Figure 3:
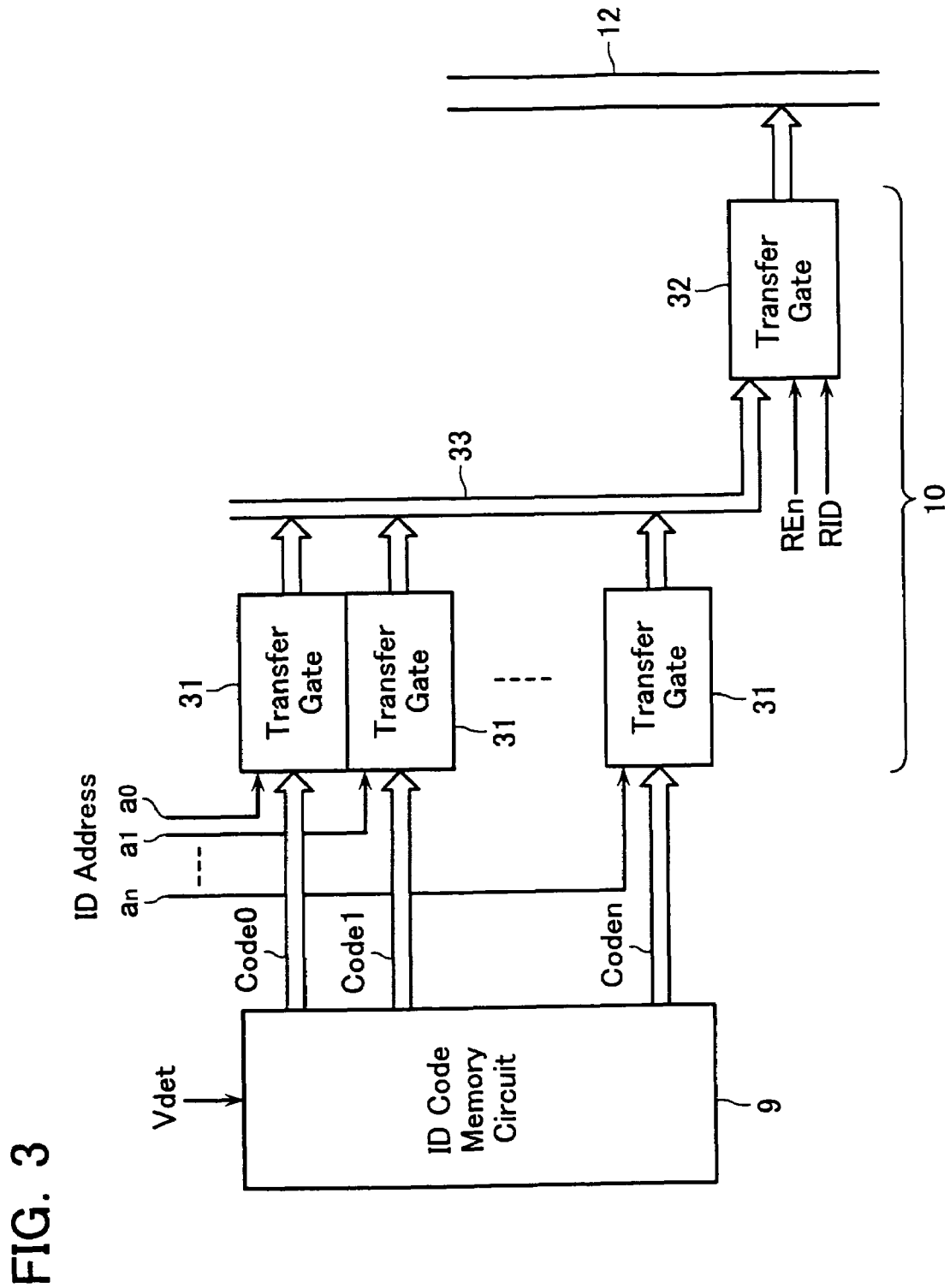
FIG. 3 shows the configuration of the ID code memory circuit and ID code generating circuit of the flash memory.

FIG. 3 shows a detail configuration of the ID code memory circuit 9 and ID code generating circuit 10 supplied with the output of the circuit 9. The ID code generating circuit 10 has a set of first transfer gate circuits 31 for selecting code data Code0, Code1, . . . , Coden, each of which is formed of, for example, 8-bit data, with ID code addresses a0, a1, . . . , an. In addition, the circuit 10 has a second transfer gate circuit 32 for selectively transfer the code data output at the output line 33 to data line 12 in accordance with the read enable signal REn and an internal control signal RID.

Some of the ID codes Code0, Code1, . . . , Coden are, as described later, generated to have common data bits, and a part of which are inverted in logic in accordance with the detected output Vdet of the power supply voltage.

Figure 4:
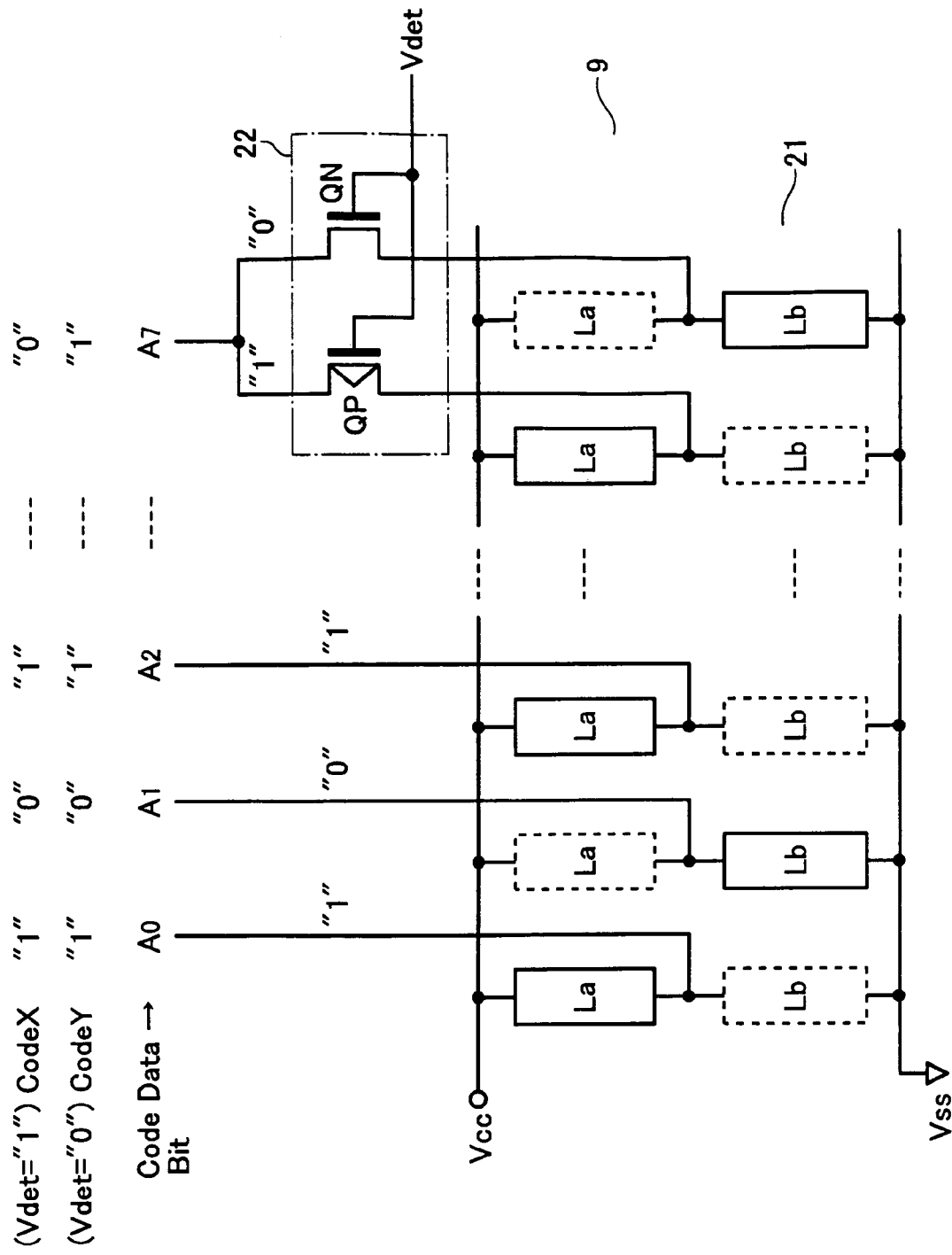
FIG. 4 shows an example, in which the ID code memory circuit is formed of a mask ROM circuit.

The ID code memory circuit 9 is, as shown in FIG. 4, formed as a mask ROM circuit 21, in which code data bits are stored as a metal pattern. In this mask ROM circuit 21, it is shown only a circuit portion of two ID code data of "Code X" and "Code Y", which contain different power supply voltage information from each other.

At the output portion of the mask ROM circuit 21, there is provided a switching circuit 22 for switching bit data "0" and "1", thereby selectively outputting either one of the two ID code data Code X and Code Y.

In the mask ROM circuit 21, metal wirings La and Lb, which are coupled to each other and coupled to power supply node Vcc and ground node Vss, respectively, are selectively formed in a mask step in the wafer process. In the example shown in FIG. 4, wirings shown by slid lines are practically formed, while ones shown by dotted lines are not formed. Based of the pattern of the metal wirings La and Lb, data bit "0" and "1" are determined. That is, in case the metal wiring La on the Vcc side is formed, the data bit becomes "1" (="H"=Vcc), while in case the metal wiring Lb on the Vss side is formed, the data bit becomes "0" (="L"=Vss).

The switching circuit 22 is prepared for data bit A7 in the example shown in FIG. 4, which has PMOS transistor QP and NMOS transistor QN. The PMOS transistor QP turns on to output Vcc (="1") when the select signal Vdet is "0" (="L"), while the NMOS transistor QN turns on to output Vss (="0") when the select signal Vdet is "1" (="H").

As a result, two ID codes with such a relationship that only one bit is reversed with each other, Code X=(1, 0, 1, . . . , 0) and Code Y=(1, 0, 1, . . . , 1), are selectively output in accordance with the power supply voltage range practically used.

As describe above, in the mask ROM circuit 21 in accordance with this embodiment, two ID codes Code x and Code Y, which contain different power supply voltage information from each other, are not stored with different data bits from each other but stored as sharing the most part of data bits. This is a result of considering that device codes including the power supply voltage information are often expressed with the same information bits except the power supply voltage information. In case there are contained different data bits except the power supply voltage information in two ID codes, these data bits may be switched in accordance with the select signal Vdet like as the above-described example.

Figure 5:
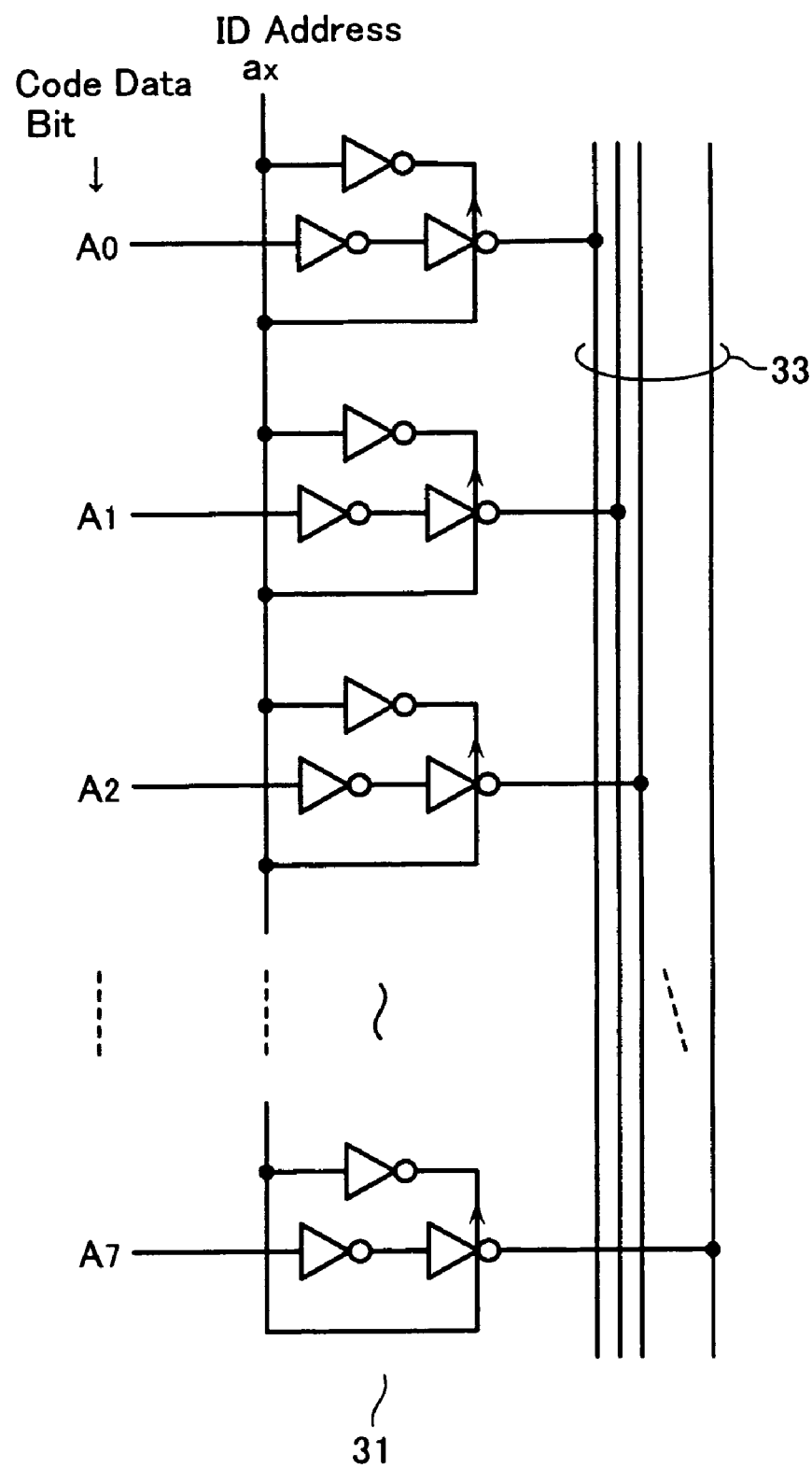
FIG. 5 shows the first data transfer circuit of the ID code generating circuit.
Figure 6:
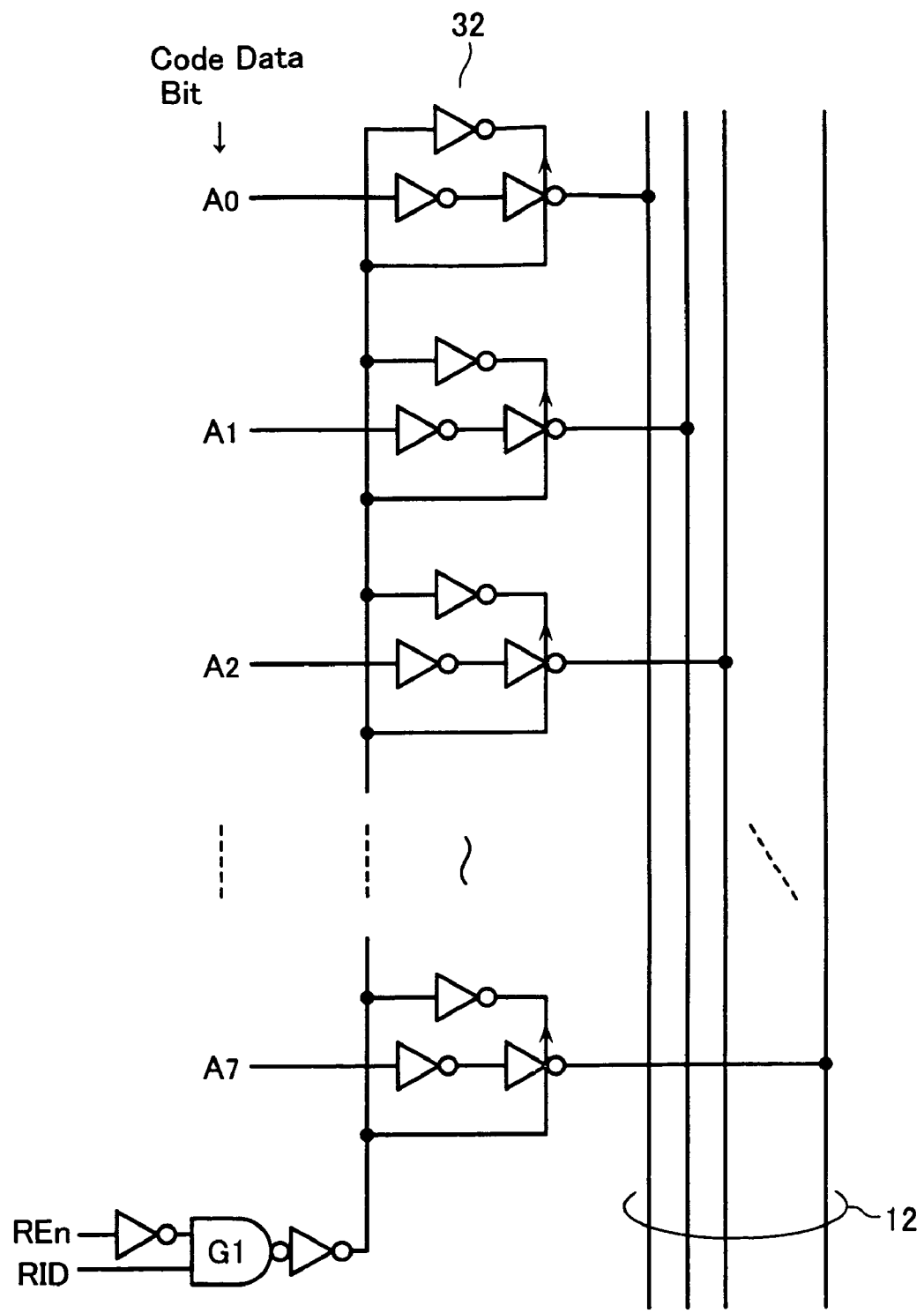
FIG. 6 shows the second data transfer circuit of the ID code generating circuit.

Each of the first transfer gate circuits 31 is, as shown in FIG. 5, formed to have eight-bit transfer gates, which are selectively activated with ID address ax(x=0, 1, . . . ). The second transfer gate circuit 32 is, as shown in FIG. 6, formed to have eight-bit transfer gates, which are activated by NAND gate G1 supplied with the read enable signal REn and internal control signal RID.

Figure 7:
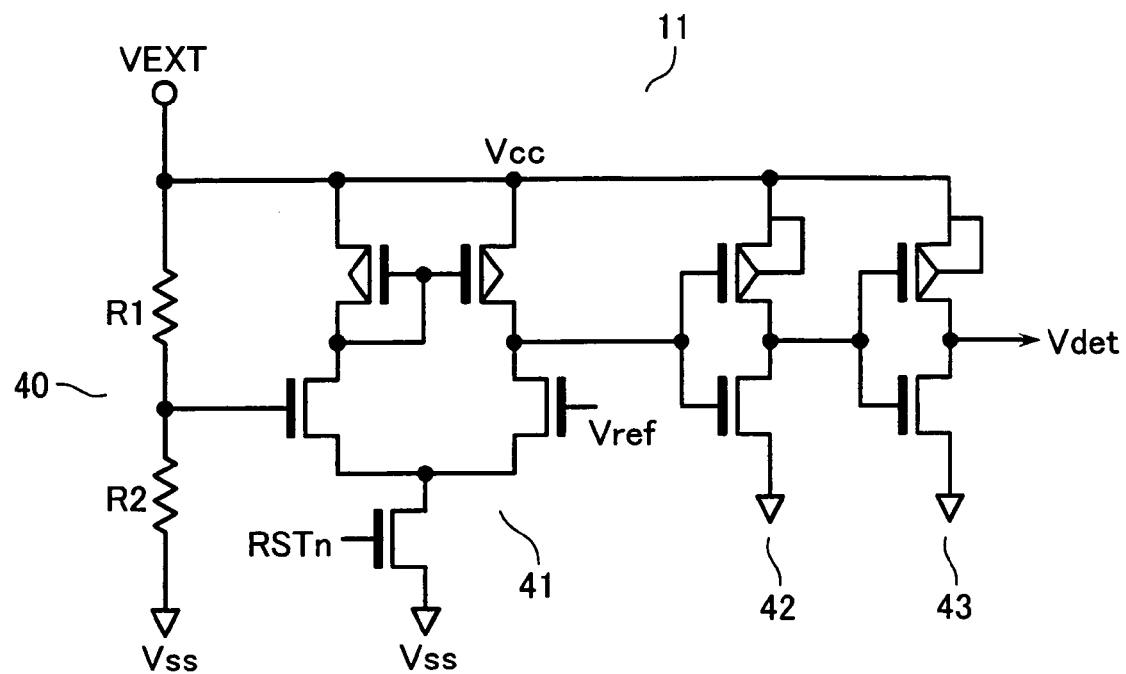
FIG. 7 shows the power supply voltage detecting circuit.

FIG. 7 shows the detailed configuration of the power supply voltage detecting circuit 11, which includes a voltage dividing circuit 40 for dividing the external power supply voltage Vcc supplied from the external power supply terminal VEXT with resistances R1 and R2 and a current-mirror type differential amplifier 41 for comparing output voltage thereof with a reference voltage Vref. The output of the differential amplifier 41 is output via two stages of inverters 42 and 43 as the detected signal Vdet.

In case the voltage detecting circuit 11 is for distinguishing between a 3V product (the minimum power supply voltage is, for example, Vccmin=2.7V) and a 1.8V product (the maximum power supply voltage is, for example, Vccmax=1.95V), the ratio of the resistances R1 and R2 is set as R1/R2=1/1; and the reference voltage Vref as Vref=1.2V. Under these conditions, the power supply voltage ranges may be distinguished with a boundary voltage Vcc=2.4V. Therefore, in case an external system with Vcc=3V is coupled to this memory, Vdet="H" (="1") is output while in case an external system with Vcc=1.8V is coupled, Vdet="L" (="0") is output. As described above, this detected output Vdet serves as the selecting/switching signal of ID code data.

Figure 8:
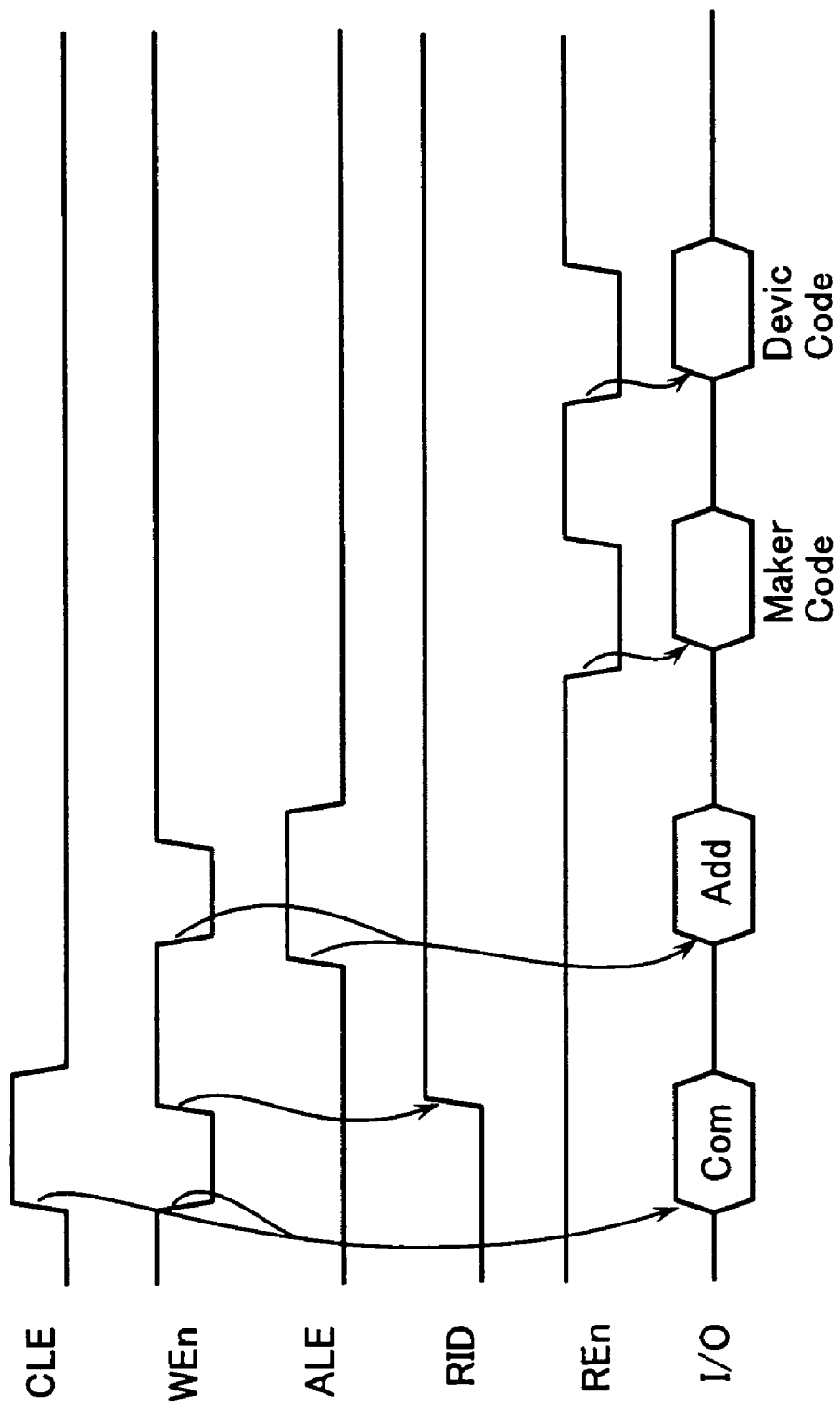
FIG. 8 shows a timing chart of the Id code outputting operation of the flash memory.

FIG. 8 shows a timing chart of the ID code outputting operation in the flash memory in accordance with this embodiment. In accordance with the command latch enable signal CLE and the write enable signal WEn, a command "COM" supplied to the external I/O terminal is taken in the chip. In case the command "COM" designates for ID code outputting, the controller 7 is set in an ID code outputting mode to output the internal control signal RID="H".

Following it an ID code address "Add" is taken in in accordance with the address latch signal ALE and the write enable signal WEn. Next, as synchronous with the read enable signals REn, a maker code with the head ID code address is output, following it a device code with the next ID code address is output.

As shown in FIG. 3, one of the first transfer gate circuits 31 is selectively activated with an ID code address, and the second transfer gate circuit 32 is activated with the read enable signal REn and the internal control signal RID. As a result, a selected ID code is output. As similar to this, various ID codes may be output as the read enable signal REn is toggled to increase the ID address.

FIG. 9 shows a part of a device code specification. As shown in this drawing, the flash memory's capacity, data storage scheme, block size, power supply voltage Vcc, I/O numbers and the like are determined, and data bits thereof are assigned to eight I/O terminals.

Note two ID codes Code1 and Code2 in the example. These codes are the same except that the power supply voltages are different from each other. If this flash memory is adaptable to both of 3V and 1.8V power supply voltages, it is required of this memory to output the device code Code1 or Code2 in accordance with the practical power supply voltage of the external system coupled to it.

According to this embodiment, the ID code memory circuit portion with relation to these device codes Code1 and Code2, stores these codes with most data bits used in common. Therefore, the circuit area of the ID code memory circuit and ID code generating circuit may be made smaller in comparison with the case where circuits are prepared independently of each other for the respective ID codes.

Figure 10:
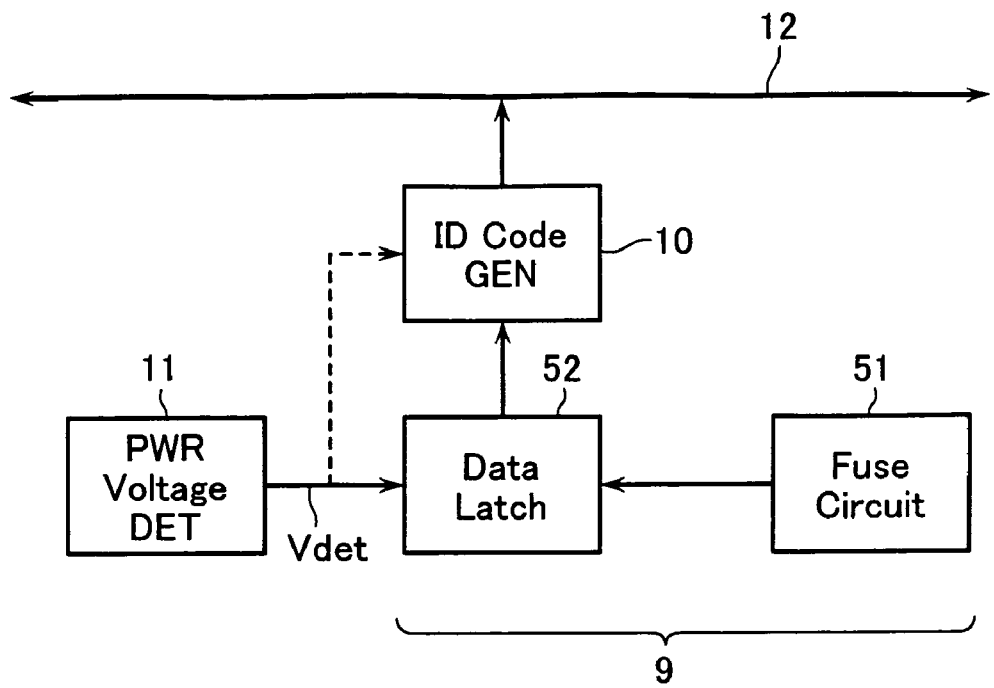
FIG. 10 shows another example of the ID memory circuit.

FIG. 10 shows another example of the ID code memory circuit 9, which includes a fuse circuit 51 and a data latch circuit 52. Fuse data in the fuse circuit 51 is transferred to and held in the data latch circuit 52. The fuse circuit 51 is formed of, for example, laser-blowing fuses or electrically programmable fuses. At the output portion of the data latch circuit 52, there is disposed a switching circuit (not shown) like the above-described embodiment.

As a result, bit data selection is performed based on the detected output Vdet of the power supply voltage, and an ID code may be selected to be output in accordance with the power supply voltage range.

Although, the switching circuit 22 is disposed at the output portion of the ID code memory circuit 9 for outputting different ID codes in accordance with the power supply voltages in the embodiment shown in FIGS. 3 and 4, it may be disposed at the output portion of the first transfer gate circuits 31.

Figure 11:
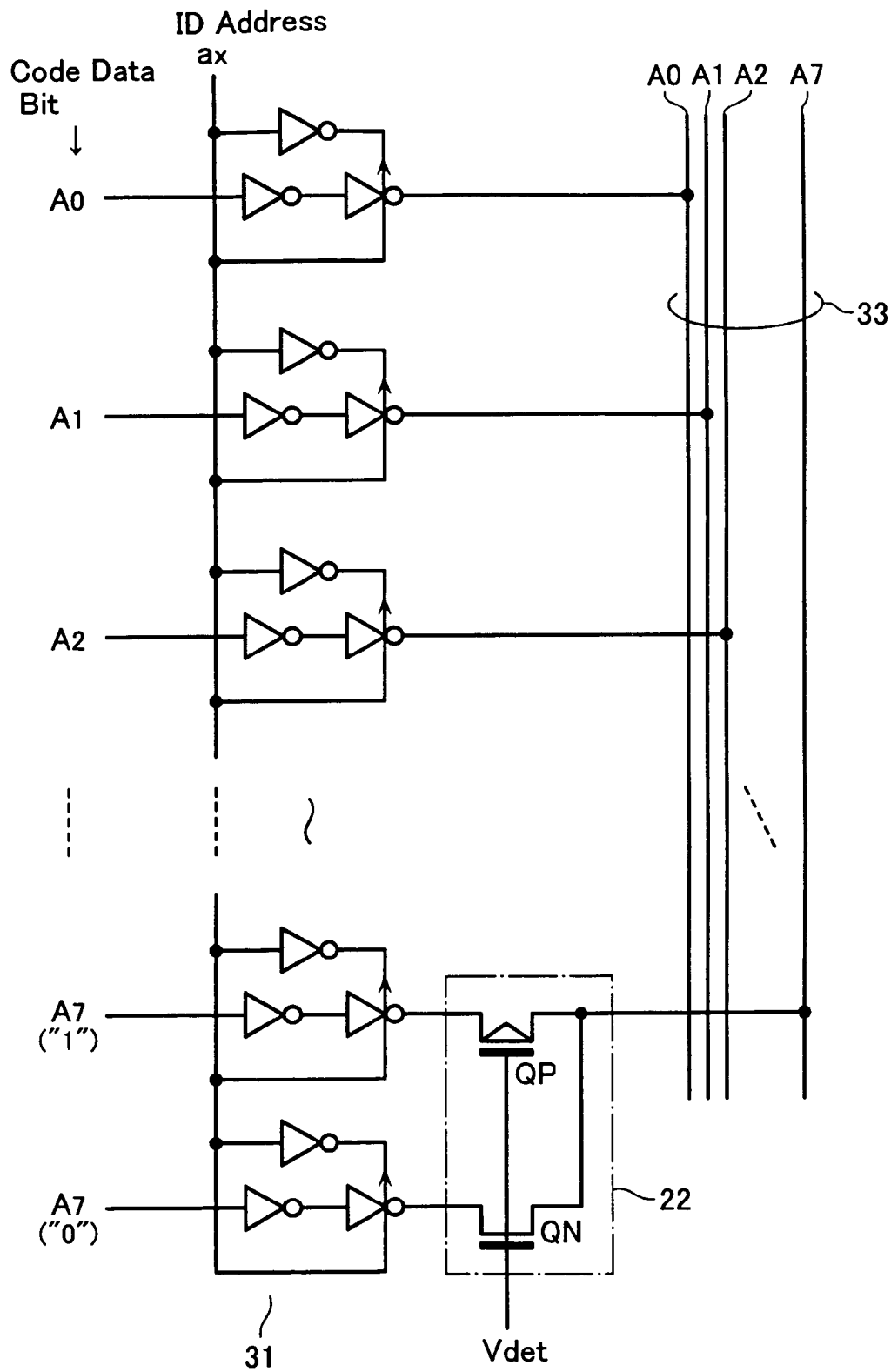
FIG. 11 shows an example in which the switching circuit is disposed at the output portion of the first data transfer circuit.

FIG. 11 shows a modification of the first transfer gate circuit 31 in comparison with that shown in FIG. 5. The same switching circuit 22 as shown in FIG. 4 is disposed at the portion of bit data A7. In this case, in FIG. 4, the switching circuit 22 is omitted, and "0" and "1" data corresponding to the bit data A7 are supplied to the first transfer gate circuit 31 as it is.

In the switching circuit 22 disposed at the output portion of the first transfer gate circuit 22, bit data A7="1" and A7="0" generated in the ID code memory circuit 9 are switched in response to the select signal Vdet. Therefore, as similar to the above-described embodiment, it becomes possible to select one of the two ID codes Code X and Code Y sharing the main data bit portion.

With respect to the embodiment shown in FIG. 10, it is possible to modify the circuit as well as the above-described embodiment.

Figure 12:
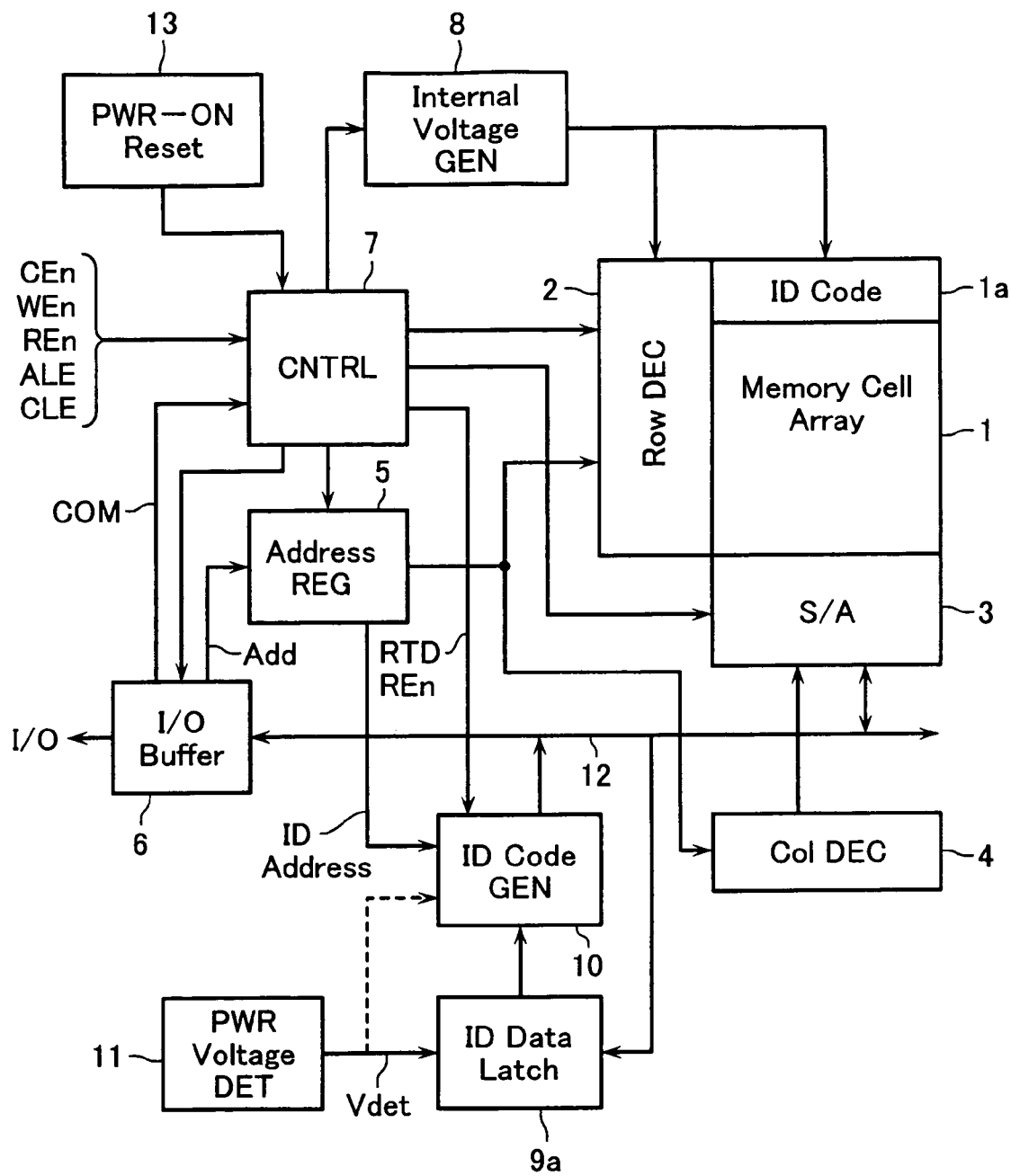
FIG. 12 shows a NAND-type flash memory in accordance with another embodiment.

FIG. 12 shows a NAND-type flash memory in accordance with another embodiment in comparison with that shown in FIG. 1. The difference between this and the above-described embodiment shown in FIG. 1 is in that there are ID storage area 1a set in the memory cell array 1 and a data latch 9a, to which the ID code data is transferred and held therein in place of the ID code memory circuit 9. For example, the ID code storage area 1a is a part of initial setup data area, which stores various initial setup data.

To direct the control to perform data read of the ID code storage area 1a at the power-on time of the memory chip, a power-on reset circuit 13 is disposed. As the power-on reset circuit 13 detects power-on, the ID code data stored in the ID code storage area 1a is automatically read out to the sense amplifier circuit 3 and transferred to the data latch 9a via the data bus 12 to be held therein.

Hereinafter, as similar to the above-described embodiments, the ID code generation circuit 10 generates and output a required ID code in response to a command.

With respect to the ID code storage, it is possible to use a combination of at least two selected in the mask ROM circuit 21 shown in FIG. 4, the fuse circuit 52 shown in FIG. 10 and the ID storage area 1a in the cell array 1 as shown in FIG. 12.

As an embodiment, an electric card using the non-volatile semiconductor memory devices according to the above-described embodiments of the present invention and an electric device using the card will be described bellow.

Figure 13:
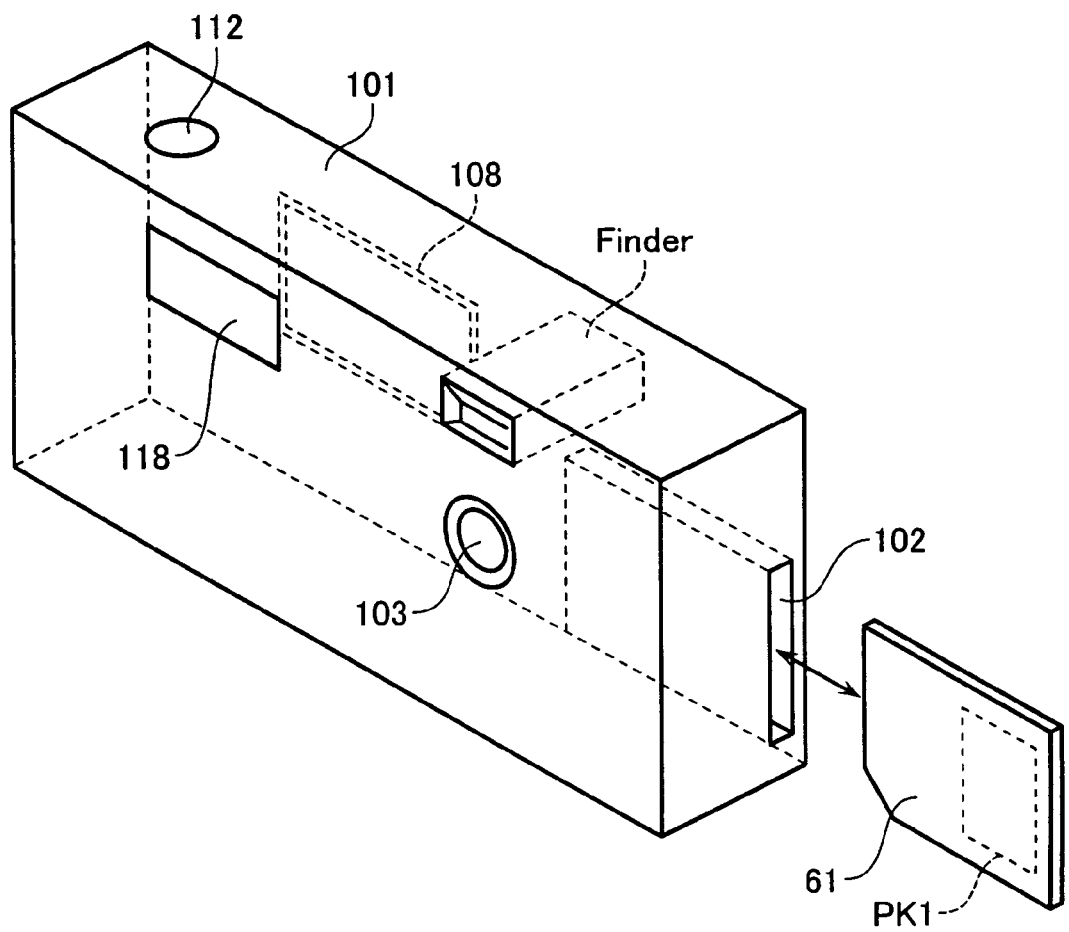
FIG. 13 shows another embodiment applied to a digital still camera.

FIG. 13 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102. It should be appreciated that this electric card has an external terminal, to which the above-described ID code is output. That is, for a host device, the ID code is detectable via the external terminal on the electric card.

Figure 14:
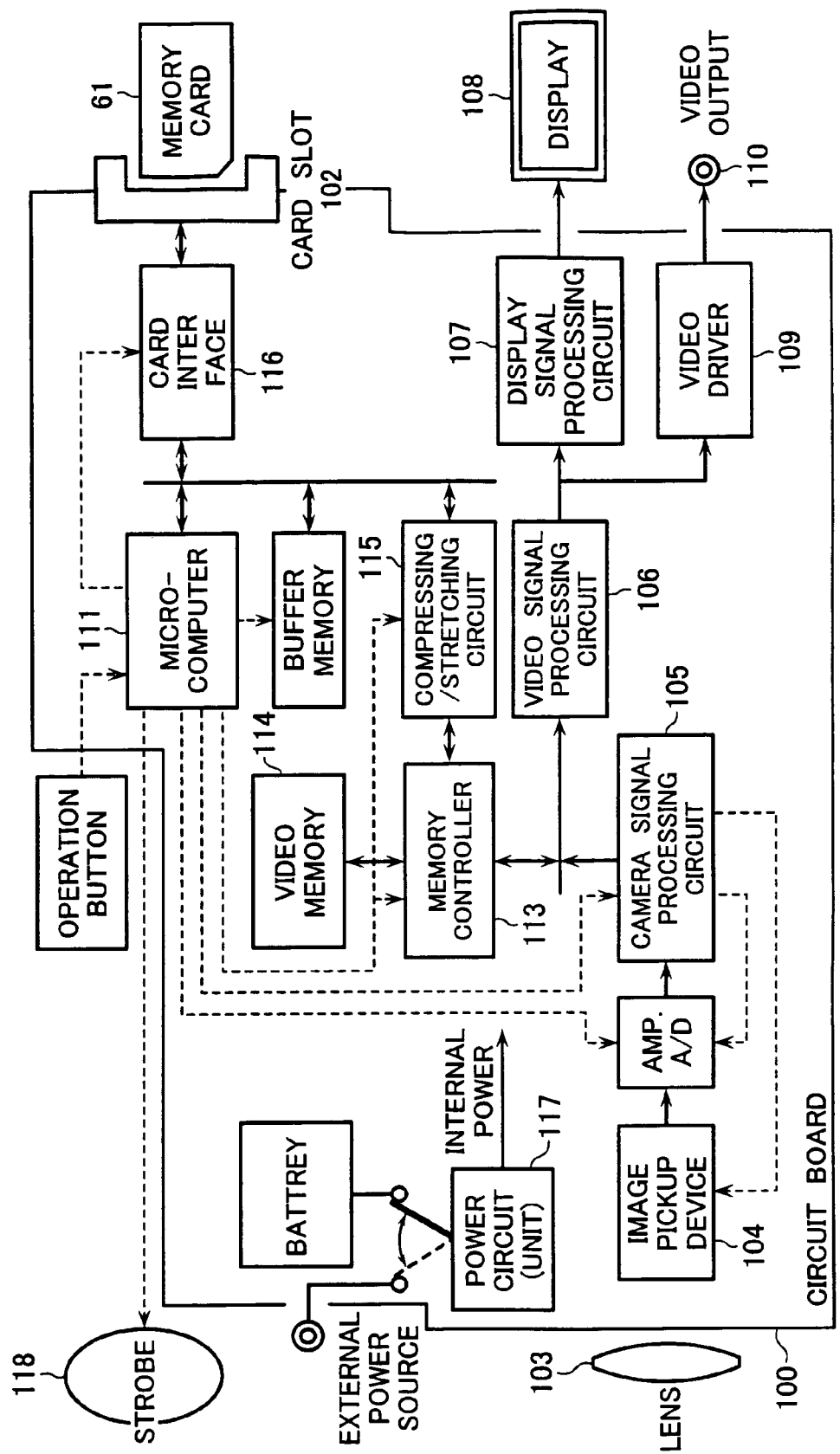
FIG. 14 shows the internal configuration of the digital still camera.
Figure 15A:
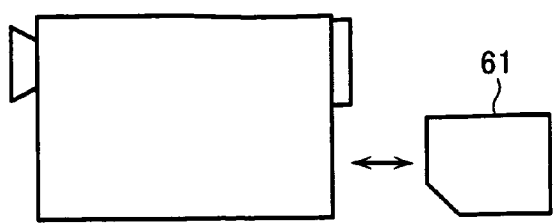
FIGS. 15A to 15J show other electric devices to which the embodiment is applied.
Figure 15F:
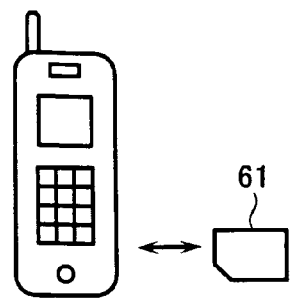
Figure 15B:
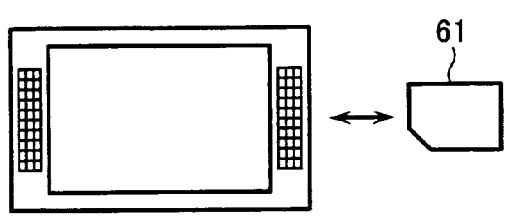
Figure 15G:
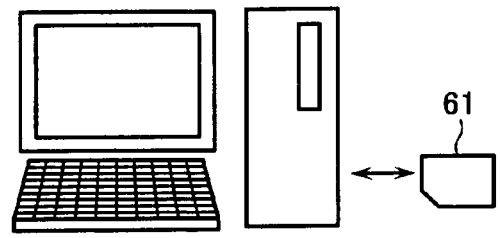
Figure 15C:
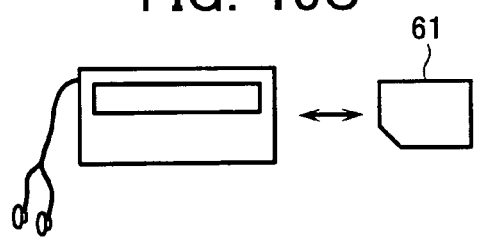
Figure 15H:
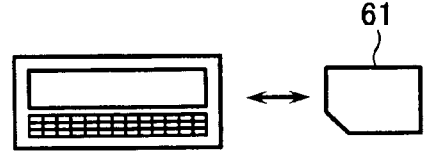
Figure 15D:
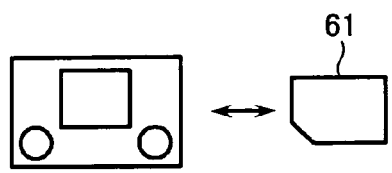
Figure 15I:
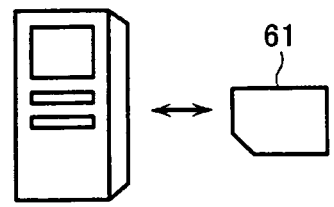
Figure 15E:
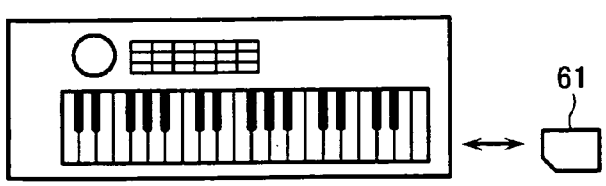
Figure 15J:
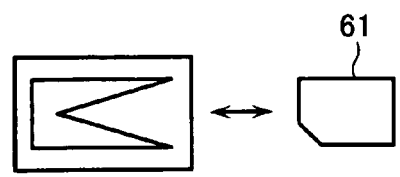

FIG. 14 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 15A to 15J, as well as in portable electric devices. That is, the electric card can also be used in a video camera shown in FIG. 15A, a television set shown in FIG. 15B, an audio apparatus shown in FIG. 15C, a game apparatus shown in FIG. 15D, an electric musical instrument shown in FIG. 15E, a cell phone shown in FIG. 15F, a personal computer shown in FIG. 15G, a personal digital assistant (PDA) shown in FIG. 15H, a voice recorder shown in FIG. 15I, and a PC card shown in FIG. 15J.

This invention is not limited to the above-described embodiment. For example, while it has been explained a NAND-type flash memory, it should be appreciated that the present invention may be applied to other types of flash memories, DRAM, SRAM, and various semiconductor integrated circuit devices except memories. Further, it will be understood by those skilled in the art that various changes in form and detail may be made without departing from the spirit, scope, and teaching of the invention.

What is claimed is:

1. A semiconductor integrated circuit device comprising:
   an ID code memory circuit configured to store ID code data bits in a non-volatile manner;
   an ID code generating circuit configured to generate an ID code based on the data bits stored in the ID code memory circuit and output it to an external terminal;
   a power supply voltage detecting circuit configured to detect a power supply voltage supplied from the external and supply a select signal to at least one of the ID code memory circuit and ID code generating circuit for selectively generating one of ID codes, data bits of which are different from each other at least in part in correspondence with power supply voltage levels.

2. The semiconductor integrated circuit device according to claim 1, wherein
   the device is configured to be adaptable to at least two, first and second, power supply voltages with different voltage ranges from each other, and wherein
   two ID codes, which are to be output respectively when the first and second supply voltages are supplied, are different in partial data bits.

3. The semiconductor integrated circuit device according to claim 1, wherein
   the ID code memory circuit is configured to store at least two ID codes, data bits of which are different from each other in part, the remaining main portions being used in common to the two ID codes, and further comprising
   a switching circuit disposed at either one side of the ID code memory circuit and the ID code generating circuit for generating one of the two ID codes, data bits of which are inverted in logic in part in accordance with the select signal.

4. The semiconductor integrated circuit device according to claim 1, wherein
   the ID code memory circuit comprises a mask ROM circuit.

5. The semiconductor integrated circuit device according to claim 1, wherein the ID code memory circuit comprises:
   a fuse circuit; and
   a data latch circuit, to which data bits in the fuse circuit are transferred and stored therein.

6. The semiconductor integrated circuit device according to claim 1, wherein the ID code memory circuit comprises:
   a memory cell circuit with electrically rewritable and non-volatile memory cells arranged; and
   a data latch circuit, to which data bits in the memory cell circuit are transferred and stored therein.

7. The semiconductor integrated circuit device according to claim 1, wherein the ID code memory circuit comprises a combination of at least two selected in a mask ROM circuit, a fuse circuit and a memory cell circuit with electrically rewritable and non-volatile memory cells arranged.

8. The semiconductor integrated circuit device according to claim 1, wherein the device is a flash memory,
   and wherein the ID code memory circuit comprises:
   an ID code storage area set in a memory cell array of the flash memory; and
   a data latch circuit, to which data bits in the ID code storage area are transferred and stored therein.

9. The semiconductor integrated circuit device according to claim 1, wherein the ID code generating circuit comprises:

first transfer gate circuits for generating one of plural ID codes in the ID code memory circuit, which is directed by an address; and a second transfer gate circuit, which is activated with a read select signal to output the ID code transferred via the first transfer circuits to an external terminal.

10. A semiconductor integrated circuit device comprising:

a memory cell array, in which electrically rewritable and non-volatile memory cells are arranged;

a read/write circuit configured to read data of and write data in the memory cell array;

an ID code memory circuit configured to store ID code data bits in a non-volatile manner;

an ID code generating circuit configured to generate an ID code based on the data bits stored in the ID code memory circuit and output it to an external terminal;

a power supply voltage detecting circuit configured to detect a power supply voltage supplied from the external and supply a select signal to at least one of the ID code memory circuit and ID code generating circuit for selectively generating one of ID codes, data bits of which are different from each other at least in part in correspondence with power supply voltage levels.

11. The semiconductor integrated circuit device according to claim 10, wherein the device is configured to be adaptable to at least two, first and second, power supply voltages with different voltage ranges from each other, and wherein two ID codes, which are to be output respectively when the first and second power supply voltages are supplied, are different in partial data bits.

12. The semiconductor integrated circuit device according to claim 10, wherein the ID code memory circuit is configured to store at least two ID codes, data bits of which are different from each other in part, the remaining main portions being used in common to the two ID codes, and further comprising a switching circuit disposed at either one side of the ID code memory circuit and the ID code generating circuit for generating one of the two ID codes, data bits of which are inverted in logic in part in accordance with the select signal.

13. The semiconductor integrated circuit device according to claim 10, wherein the ID code memory circuit comprises a mask ROM circuit.

14. The semiconductor integrated circuit device according to claim 10, wherein the ID code memory circuit comprises:

a fuse circuit; and a data latch circuit, to which data bits in the fuse circuit are transferred and stored therein.

15. The semiconductor integrated circuit device according to claim 10, wherein the ID code memory circuit comprises:

an ID code storage area set in the memory cell array; and a data latch circuit, to which data bits in the ID code storage area are transferred and stored therein.

16. The semiconductor integrated circuit device according to claim 15, further comprising a power-on reset circuit configured to detect power-on, thereby serving for reading data of the ID code storage area and transferring it to the data latch circuit.

17. The semiconductor integrated circuit device according to claim 10, wherein the ID code memory circuit comprises a combination of at least two selected in a mask ROM circuit, a fuse circuit and an ID code storage area set in the memory cell array.

18. The semiconductor integrated circuit device according to claim 10, wherein the ID code generating circuit comprises:

first transfer gate circuits for generating one of plural ID codes in the ID code memory circuit, which is directed by an address; and a second transfer gate circuit, which is activated with a read select signal to output the ID code transferred via the first transfer circuits to an external terminal.

19. The semiconductor integrated circuit device according to claim 10, wherein the memory cell array comprises NAND cell units arranged therein, each NAND cell unit including plural memory cells connected in series.

20. An electric device equipped with an external terminal and a semiconductor integrated circuit device, the semiconductor integrated circuit device comprises:

a memory cell array, in which electrically rewritable and non-volatile memory cells are arranged;

a read/write circuit configured to read data of and write data in the memory cell array;

an ID code memory circuit configured to store ID code data bits in a non-volatile manner;

an ID code generating circuit configured to generate an ID code based on the data bits stored in the ID code memory circuit, the ID code being detectable via the external terminal;

a power supply voltage detecting circuit configured to detect a power supply voltage supplied from the external and supply a select signal to at least one of the ID code memory circuit and ID code generating circuit for selectively generating one of ID codes, data bits of which are different from each other at least in part in correspondence with power supply voltage levels.

21. The electric device according to claim 20, wherein the electric device is a memory card.

22. The electric device according to claim 20, wherein the ID code memory circuit comprises a mask ROM circuit.

23. The electric device according to claim 20, wherein the ID code memory circuit comprises:

a fuse circuit; and a data latch circuit, to which data bits in the fuse circuit are transferred and stored therein.

24. The electric device according to claim 20, wherein the ID code memory circuit comprises:

an ID code storage area set in the memory cell array; and a data latch circuit, to which data bits in the ID code storage area are transferred and stored therein.

* * * * *